(12) United States Patent
Kim

(10) Patent No.: US 11,043,978 B2
(45) Date of Patent: Jun. 22, 2021

(54) BIDIRECTIONAL COUPLER

(71) Applicant: Murata Manufacturing Co., Ltd., Kyoto (JP)

(72) Inventor: Ryangsu Kim, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/688,980

(22) Filed: Aug. 29, 2017

(65) Prior Publication Data
US 2018/0062672 A1  Mar. 1, 2018

(30) Foreign Application Priority Data

Aug. 30, 2016  (JP) .............................. JP2016-167968

(51) Int. Cl.
| | | |
|---|---|---|
| *H04B 1/04* | (2006.01) | |
| *H03F 3/60* | (2006.01) | |
| *H03F 3/24* | (2006.01) | |
| *H03F 1/56* | (2006.01) | |

(Continued)

(52) U.S. Cl.
CPC ............ *H04B 1/0458* (2013.01); *H01P 5/04* (2013.01); *H01P 5/18* (2013.01); *H03F 1/56* (2013.01);
(Continued)

(58) Field of Classification Search
CPC ........ H04B 1/0458; H04B 1/44; H04B 1/005; H01P 5/04; H01P 5/18; H01P 5/185; H03G 3/3042; H04W 52/10; H03H 7/48
See application file for complete search history.

(56) References Cited

U.S. PATENT DOCUMENTS

| | | | | |
|---|---|---|---|---|
| 5,598,169 | A * | 1/1997 | Drabeck ................. | G01S 13/75 343/701 |
| 5,688,050 | A * | 11/1997 | Sterzer ................... | A61B 5/015 374/121 |

(Continued)

FOREIGN PATENT DOCUMENTS

| | | |
|---|---|---|
| JP | 2013-126067 A | 6/2013 |
| WO | 2016/158314 A1 | 10/2016 |

OTHER PUBLICATIONS

Calibration-Free Return Loss Meas, Barrett, Mar. 2016 https://www.wirelessdesignmag.com/article/2016/03/calibration-free-return-loss-measurement.*

(Continued)

*Primary Examiner* — Jianxun Yang
(74) *Attorney, Agent, or Firm* — Peame & Gordon LLP

(57) ABSTRACT

A bidirectional coupler includes the following elements. A main line and a sub-line are electromagnetically coupled. First and second resistors are each grounded at one end. First and second switches connect the sub-line to the first and second resistors or a third port. A third resistor is disposed between one end of the sub-line and the first switch or between the other end of the sub-line and the second switch. When detecting an input signal, the first switch electrically connects one end of the sub-line to the other end of the first resistor and the second switch electrically connects the other end of the sub-line to the third port. When detecting a reflected signal, the first switch electrically connects one end of the sub-line to the third port and the second switch electrically connects the other end of the sub-line to the other end of the second resistor.

15 Claims, 10 Drawing Sheets

(51) Int. Cl.
  *H03H 7/48* (2006.01)
  *H01P 5/04* (2006.01)
  *H01P 5/18* (2006.01)
  *H04B 1/44* (2006.01)

(52) U.S. Cl.
  CPC ............... *H03F 3/24* (2013.01); *H03F 3/60* (2013.01); *H03H 7/48* (2013.01); *H03F 2200/204* (2013.01); *H03F 2200/451* (2013.01); *H04B 1/44* (2013.01)

(56) References Cited

U.S. PATENT DOCUMENTS

| | | | | |
|---|---|---|---|---|
| 5,884,149 | A * | 3/1999 | Jaakola | H03G 3/3042 455/103 |
| 6,018,650 | A * | 1/2000 | Petsko | H04W 52/10 455/232.1 |
| 2001/0010483 | A1* | 8/2001 | Akiya | H03F 1/0261 330/298 |
| 2005/0159119 | A1* | 7/2005 | Kataoka | H03F 1/52 455/127.2 |
| 2016/0079650 | A1* | 3/2016 | Solomko | H03H 7/48 333/103 |
| 2016/0172740 | A1* | 6/2016 | Srirattana | H01P 5/185 333/111 |
| 2018/0048046 | A1* | 2/2018 | Noguchi | H01P 1/24 |

OTHER PUBLICATIONS

Evaluate Your 3D Inductor Design, Smith, Apr. 2016 https://www.comsol.com/blogs/evaluate-your-3d-inductor-design-with-comsol-multiphysics/(Year: 2016).*

* cited by examiner

BIDIRECTIONAL COUPLER

This application claims priority from Japanese Patent Application No. 2016-167968 filed on Aug. 30, 2016. The content of this application is incorporated herein by reference in its entirety.

BACKGROUND OF THE DISCLOSURE

1. Field of the Disclosure

The present disclosure relates to a bidirectional coupler.

2. Description of the Related Art

A detector circuit for detecting a signal level is used in a wireless communication device, such as a cellular phone. For example, Japanese Unexamined Patent Application Publication No. 2013-126067 discloses a directional coupler for detecting a transmit signal outputted from a wireless local area network (LAN) module to an antenna.

BRIEF SUMMARY OF THE DISCLOSURE

In a wireless communication device, the impedance of an antenna changes due to the contact of the part of the body with the antenna, for example. A change in the impedance of the antenna varies the level of a reflected signal returned from the antenna. It is thus desirable to control the power of a transmit signal in accordance with the level of a reflected signal returned from the antenna in a wireless communication device. Although the directional coupler disclosed in the above-described publication is capable of detecting a transmit signal outputted from a wireless LAN module to an antenna, it is unable to detect a reflected signal returned from the antenna.

The present disclosure has been made in view of the above-described background. It is an object of the present disclosure to provide a bidirectional coupler that is capable of detecting signals in two directions.

According to a preferred embodiment of the present disclosure, there is provided a bidirectional coupler including first through third ports, a main line, a sub-line, first through third resistors, and first and second switches. An input signal is inputted into the first port. The input signal is outputted from the second port. A detection signal indicating a result of detecting the input signal or a detection signal indicating a result of detecting a reflected signal is outputted from the third port. The reflected signal is returned as a result of outputting the input signal. The main line is connected at one end to the first port and at the other end to the second port. The sub-line is electromagnetically coupled with the main line. The first resistor is grounded at one end. The second resistor is grounded at one end. The first switch connects one end of the sub-line to the other end of the first resistor or the third port. The second switch connects the other end of the sub-line to the other end of the second resistor or the third port. The third resistor is disposed between one end of the sub-line and the first switch or between the other end of the sub-line and the second switch. When the bidirectional coupler detects the input signal, the first switch electrically connects one end of the sub-line to the other end of the first resistor and the second switch electrically connects the other end of the sub-line to the third port. When the bidirectional coupler detects the reflected signal, the first switch electrically connects one end of the sub-line to the third port and the second switch electrically connects the other end of the sub-line to the other end of the second resistor.

According to a preferred embodiment of the present disclosure, it is possible to provide a bidirectional coupler that is capable of detecting signals in two directions.

Other features, elements, characteristics and advantages of the present disclosure will become more apparent from the following detailed description of the preferred embodiments of the present disclosure with reference to the attached drawings.

DETAILED DESCRIPTION OF THE DISCLOSURE

Figure 1:
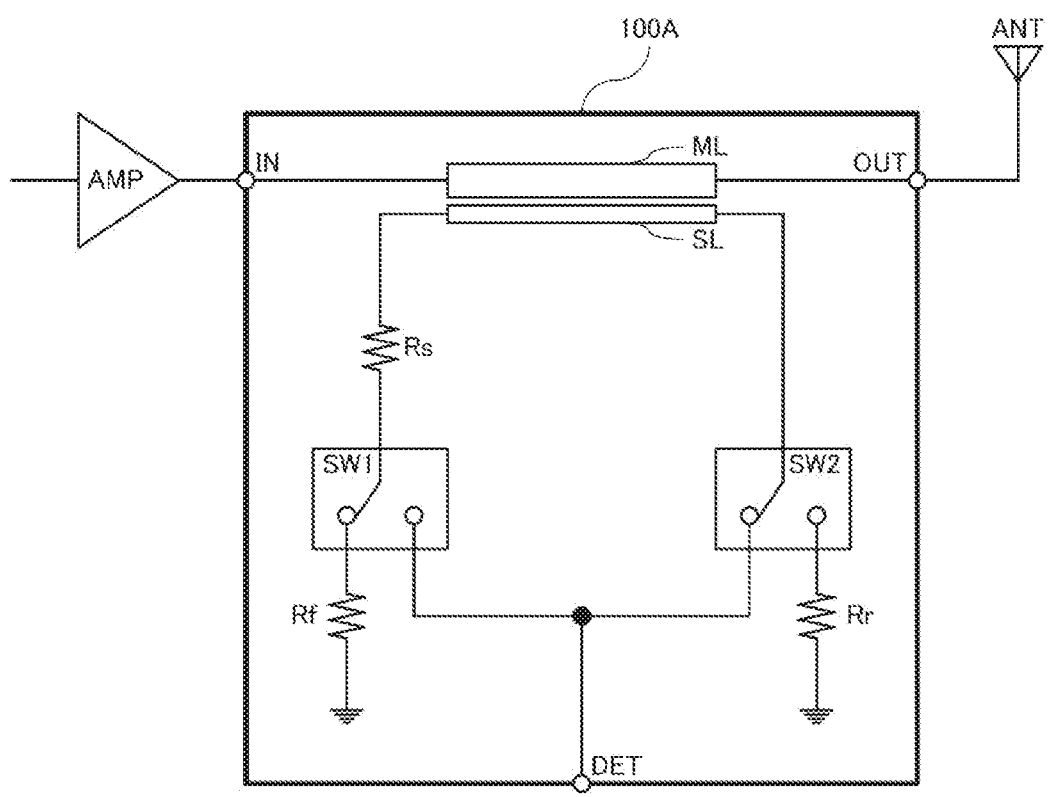
FIG. 1 illustrates an example of the configuration of a bidirectional coupler according to an embodiment of the disclosure.

An embodiment of the disclosure will be described below with reference to FIGS. 1 through 3. FIG. 1 illustrates an example of the configuration of a bidirectional coupler 100A according to an embodiment of the disclosure. The bidirectional coupler 100A is able to detect a signal transmitted from an amplifier circuit AMP to an antenna ANT (forward). The bidirectional coupler 100A is also able to detect a reflected signal returned from the antenna ANT and outputted to the amplifier circuit AMP (reverse).

As shown in FIG. 1, the bidirectional coupler 100A includes an input port IN, an output port OUT, a detection port DET, a main line ML, a sub-line SL, switches SW1 and SW2, and resistors Rf, Rr, and Rs.

The main line ML is connected at one end to the input port IN (the first port) and at the other end to the output port OUT (the second port). A transmit signal (input signal) is supplied from the amplifier circuit AMP to the input port IN. This transmit signal is supplied to the antenna ANT via the main line ML and the output port OUT. A reflected signal returned from the antenna ANT which has received the transmit signal is supplied to the output port OUT. The sub-line SL is electromagnetically coupled with the main line ML. The sub-line SL is connected at one end to the switch SW1 and at the other end to the switch SW2.

One end of the resistor Rf (the first resistor) is grounded, and the other end thereof is connected to the switch SW1. One end of the resistor Rr (the second resistor) is grounded, and the other end thereof is connected to the switch SW2. The resistor Rs is disposed between the sub-line SL and the switch SW1. The detection port DET (the third port) is connected to the switches SW1 and SW2. A signal (detection signal) indicating a result of detecting the transmit signal or a signal (detection signal) indicating a result of detecting the reflected signal is outputted from the detection port DET. The resistor Rs (the third resistor) is provided for shifting the peak of the reverse directivity to the high frequency side, which will be discussed later.

The switch SW1 (the first switch) electrically connects one end of the sub-line SL to the resistor Rf or the detection port DET in accordance with a control signal supplied from an external source. The switch SW2 (the second switch) electrically connects the other end of the sub-line SL to the resistor Rr or the detection port DET in accordance with a control signal supplied from an external source. More specifically, when the bidirectional coupler 100A detects a transmit signal (forward), the switch SW1 is connected to the resistor Rf, while the switch SW2 is connected to the detection port DET. When the bidirectional coupler 100A detects a reflected signal (reverse), the switch SW1 is connected to the detection port DET, while the switch SW2 is connected to the resistor Rr.

Figure 2:
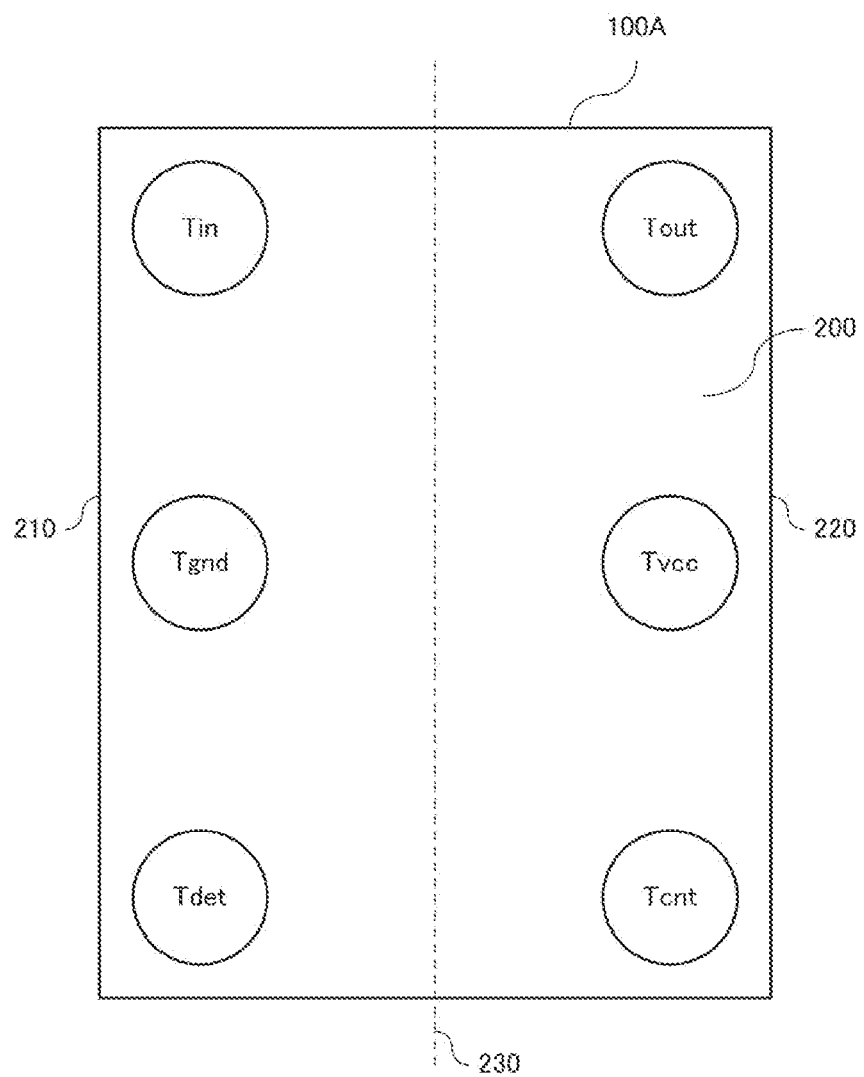
FIG. 2 illustrates an example of the arrangement of terminals in the bidirectional coupler shown in FIG. 1.

FIG. 2 illustrates an example of the arrangement of terminals in the bidirectional coupler 100A. The bidirectional coupler 100A is formed as a chip element. The terminals shown in FIG. 2 are included in this chip element. More specifically, the bidirectional coupler 100A includes terminals Tin, Tout, Tgnd, Tvcc, Tdet, and Tcnt on a back side 200 of the chip element. These terminals are connected to a substrate by flip-chip mounting, for example. The terminal Tin is connected to the input port IN, and the terminal Tout is connected to the output port OUT. The terminal Tgnd is grounded, and a power supply voltage is supplied to the terminal Tvcc. The terminal Tdet is connected to the detection port DET, and control signals for controlling the switches SW1 and SW2 are supplied to the terminal Tcnt.

As shown in FIG. 2, the terminals Tin, Tgnd, and Tdet are disposed along a side 210, while the terminals Tout, Tvcc, and Tcnt are disposed along a side 220 which opposes the side 210. The terminals Tin, Tgnd, and Tdet and the terminals Tout, Tvcc, and Tcnt are arranged substantially symmetrically with respect to a center line 230 substantially parallel with the sides 210 and 220. However, the terminal Tgnd is grounded, while a power supply voltage is supplied to the terminal Tvcc, which causes a disparity in the potential and impedance between the right and left sides on the center line 230. This may disturb the symmetrical characteristics of the directivity between when a transmit signal from the terminal Tin to the terminal Tout is detected (forward) and when a reflected signal from the terminal Tout to the terminal Tin is detected (reverse).

To compensate for the disturbance of the symmetrical characteristics of the directivity, the resistor Rs is provided in the bidirectional coupler 100A. This will be explained below by referring to the following simulation results.

Figure 3:
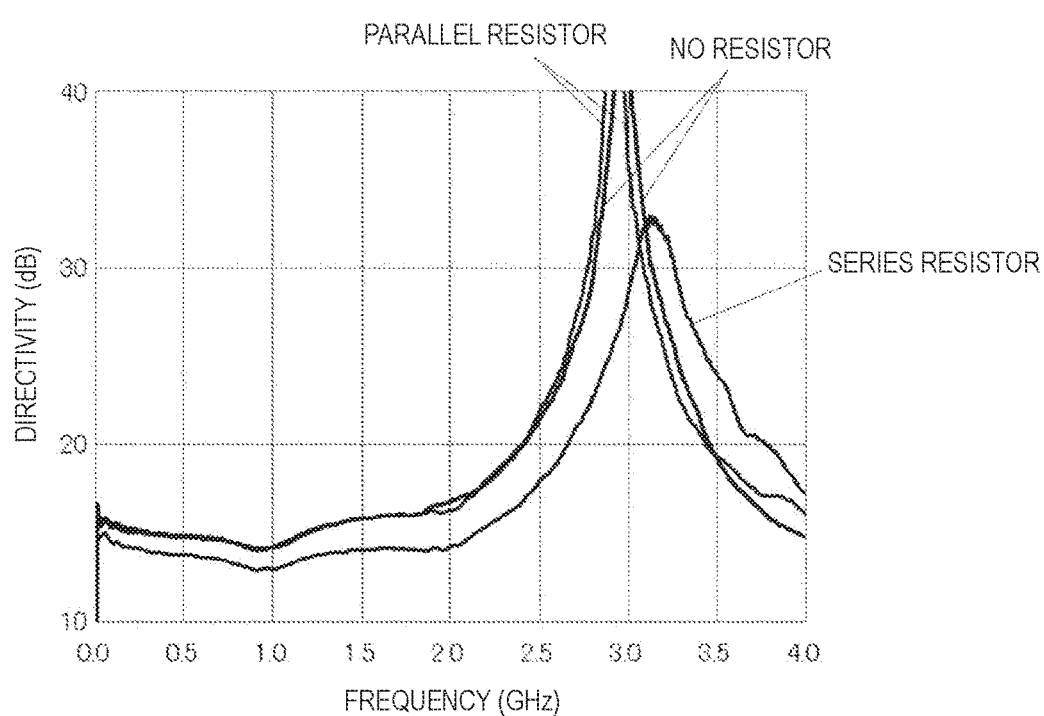
FIG. 3 is a graph illustrating an example of the simulation results of the directivity.

FIG. 3 is a graph illustrating an example of the simulation results of the directivity. In FIG. 3, the horizontal axis indicates the frequency (GHz), and the vertical axis indicates the directivity (dB). FIG. 3 shows the reverse directivity in cases in which: the resistor Rs is provided between the sub-line SL and the switch SW1 (series resistor shown in FIG. 1); the resistor Rs is not provided (no resistor); and the resistor Rs is provided in parallel with the resistor Rf (parallel resistor). Providing the resistor Rs between the sub-line SL and the switch SW1 can shift the peak of the reverse directivity to the high frequency side, as shown in FIG. 3. Providing the resistor Rs between the sub-line SL and the switch SW2 instead of between the sub-line SL and the switch SW1 can shift the peak of the forward directivity to the high frequency side. Providing the resistor Rs between the sub-line SL and the switch SW1 or between the sub-line SL and the switch SW2 can compensate for the disturbance of the symmetrical characteristics of the directivity. The terminal arrangement shown in FIG. 2 is only an example, and the terminals may be arranged in a different manner. The connection between the terminals and the substrate may be performed by a method other than flip-chip mounting, by wire bonding, for example.

Figure 4:
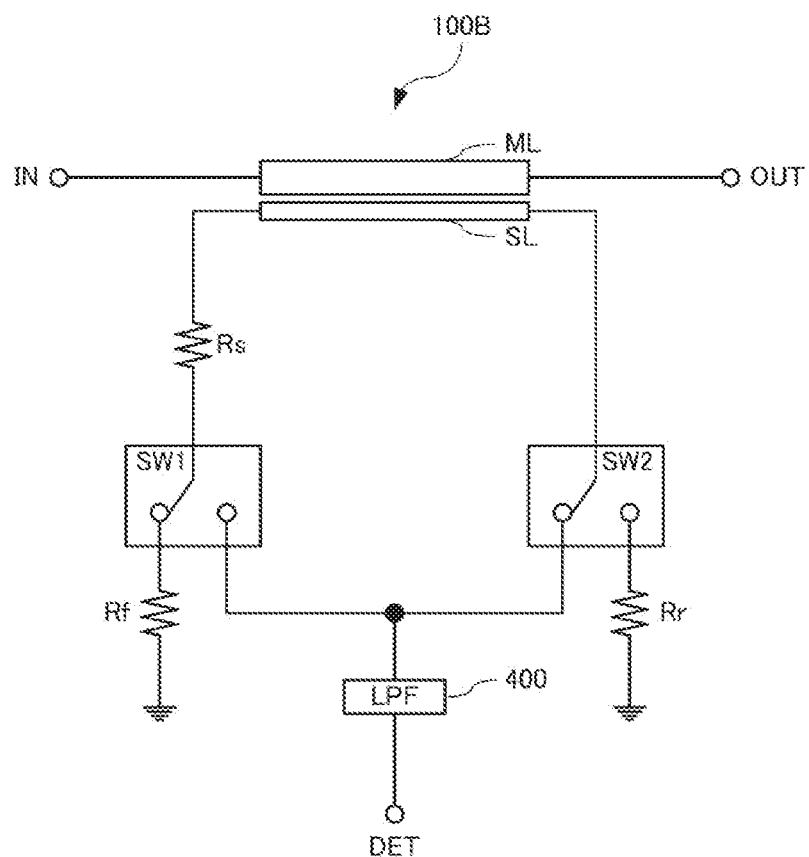
FIG. 4 illustrates an example of the configuration of a bidirectional coupler according to another embodiment of the disclosure.

FIG. 4 illustrates an example of the configuration of a bidirectional coupler 100B according to another embodiment of the disclosure. The same elements as those of the bidirectional coupler 100A shown in FIG. 1 are designated by like reference numerals, and a detailed explanation thereof will be omitted.

The bidirectional coupler 100B differs from the bidirectional coupler 100A in that it includes a low pass filter (LPF) 400 in addition to the elements of the bidirectional coupler 100A. The LPF 400 is disposed between the switches SW1 and SW2 and the detection port DET. A detection signal outputted from the switch SW1 or SW2 passes through the LPF 400 and is outputted from the detection port DET.

Figure 5:
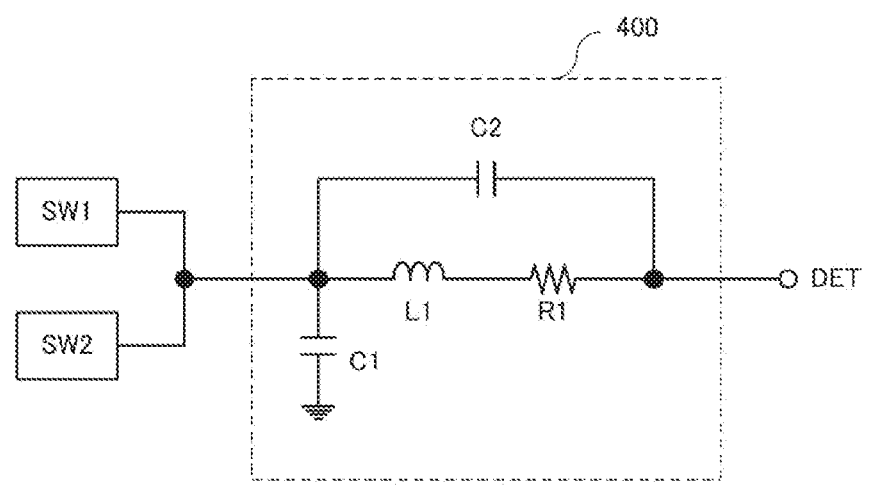
FIG. 5 illustrates an example of the configuration of a low pass filter (LPF)

FIG. 5 illustrates an example of the configuration of the LPF 400. The LPF 400 includes capacitors C1 and C2, an inductor L1, and a resistor R1. One end of the capacitor C1 is connected to the switches SW1 and SW2, and the other end thereof is grounded. One end of the capacitor C2 is connected to the switches SW1 and SW2, and the other end thereof is connected to the detection port DET. The inductor L1 and the resistor R1 are connected in series with each other. The inductor L1 and the resistor R1 are each connected at one end to the switches SW1 and SW2 and at the other end to the detection port DET. In FIG. 5, the inductor L1 is provided closer to the switches SW1 and SW2, while the resistor R1 is provided closer to the detection port DET. However, the positional relationship between the inductor L1 and the resistor R1 may be opposite to that shown in FIG. 5.

The LPF 400 is provided for decreasing the frequency dependency of the coupling degree. This will be explained below by referring to the following simulation results.

Figure 6:
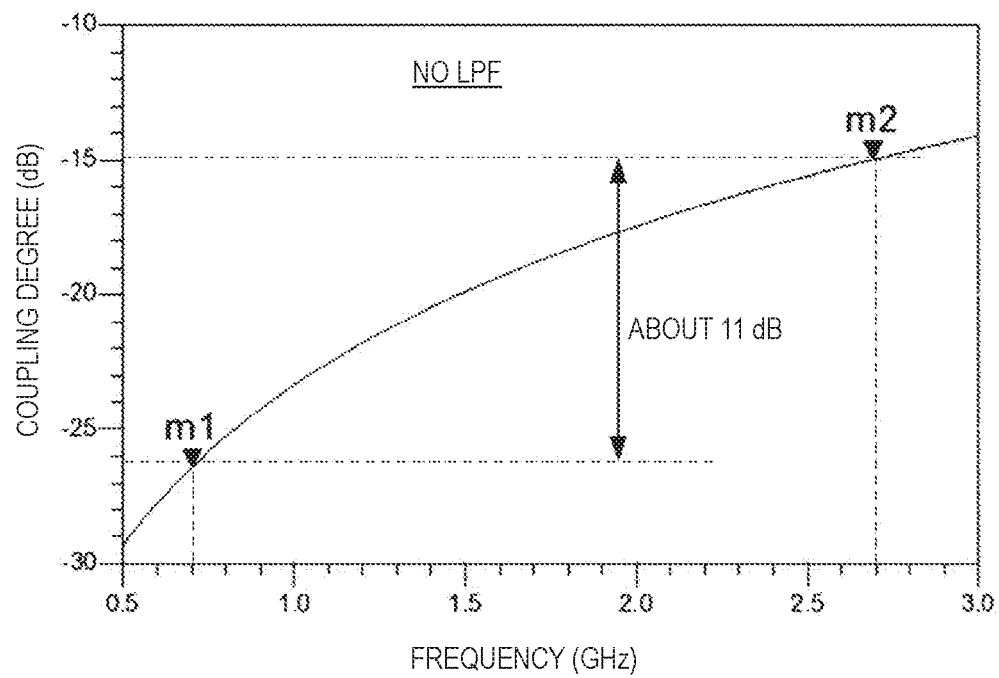
FIG. 6 is a graph illustrating an example of the simulation results of the frequency characteristics of the coupling degree in a bidirectional coupler without the LPF.

FIG. 6 is a graph illustrating an example of the simulation results of the frequency characteristics of the coupling degree in a bidirectional coupler without the LPF 400. In FIG. 6, the horizontal axis indicates the frequency (GHz), and the vertical axis indicates the coupling degree (dB). FIG. 6 shows that the coupling degree increases as the frequency becomes higher. For example, the difference in the coupling degree in a frequency range of about 700 MHz to 2.7 GHz is about 11 dB.

Figure 7:
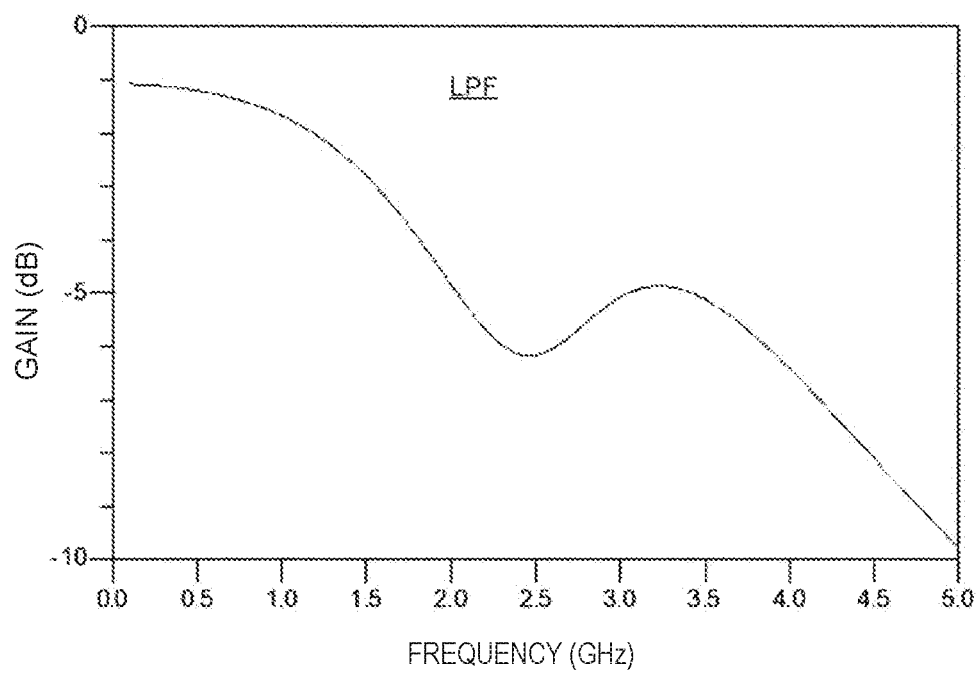
FIG. 7 is a graph illustrating an example of the simulation results of the frequency characteristics of the gain of the LPF.

FIG. 7 is a graph illustrating an example of the simulation results of the frequency characteristics of the gain of the LPF 400. In FIG. 7, the horizontal axis indicates the frequency (GHz), and the vertical axis indicates the gain (dB). FIG. 7 shows that the LPF 400 exhibits characteristics in which the gain decreases as the frequency becomes higher.

Figure 8:
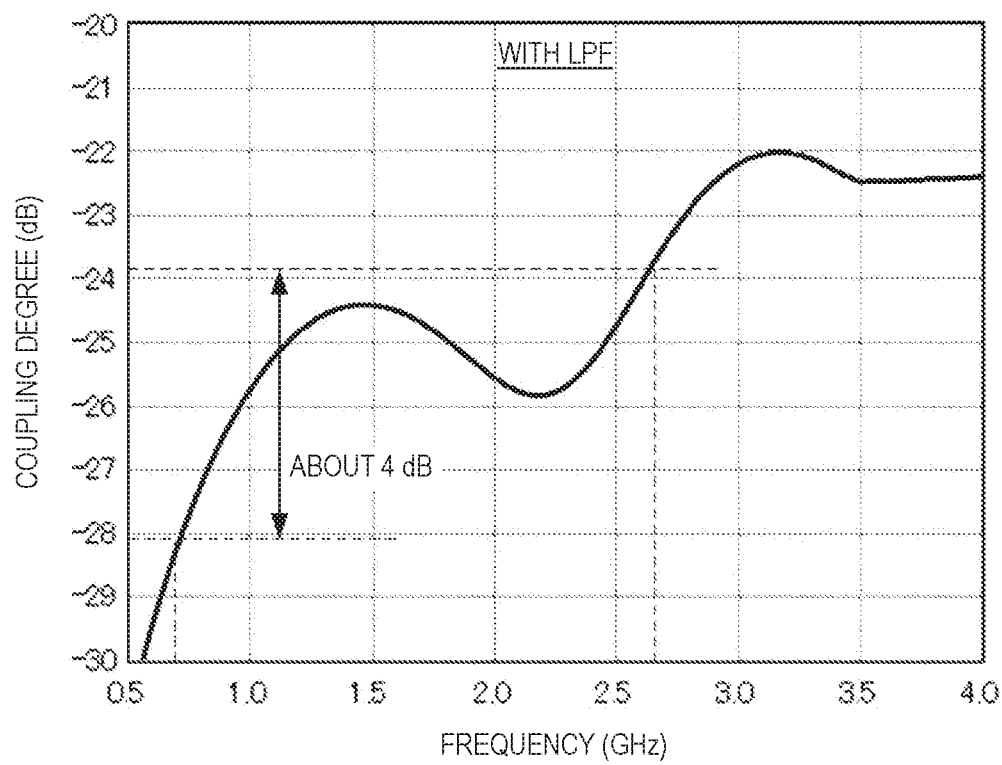
FIG. 8 is a graph illustrating an example of the simulation results of the frequency characteristics of the coupling degree in a bidirectional coupler with the LPF.

FIG. 8 is a graph illustrating an example of the simulation results of the frequency characteristics of the coupling degree in a bidirectional coupler with the LPF 400. FIG. 8 shows that the addition of the LPF 400 decreases the frequency dependency of the coupling degree. More specifically, the difference in the coupling degree in a frequency range of about 700 MHz to 2.7 GHz is reduced to about 4 dB. The provision of the LPF 400 in the bidirectional coupler 100B can decrease the frequency dependency of the coupling degree.

Figure 9:
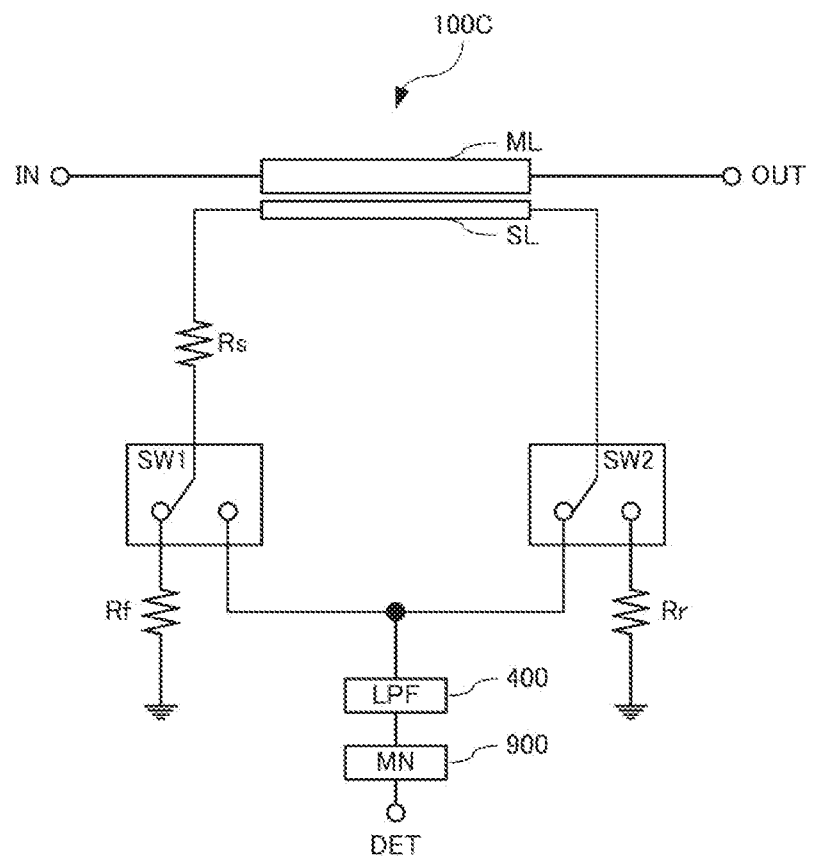
FIG. 9 illustrates an example of the configuration of a bidirectional coupler according to another embodiment of the disclosure.

FIG. 9 illustrates an example of the configuration of a bidirectional coupler 100C according to another embodiment of the disclosure. The same elements as those of the bidirectional coupler 100B shown in FIG. 4 are designated by like reference numerals, and a detailed explanation thereof will be omitted.

The bidirectional coupler 100C differs from the bidirectional coupler 100B in that it includes a matching network (MN) 900 in addition to the elements of the bidirectional coupler 100B. The MN 900 is disposed between the LPF 400 and the detection port DET. The provision of the LPF 400 may be omitted.

The MN 900 includes, for example, an inductor connected in series between the LPF 400 and the detection port DET. The provision of the MN 900 in the bidirectional coupler 100C can compensate for a loss caused by a reflected signal returned from the detection port DET.

Figure 10:
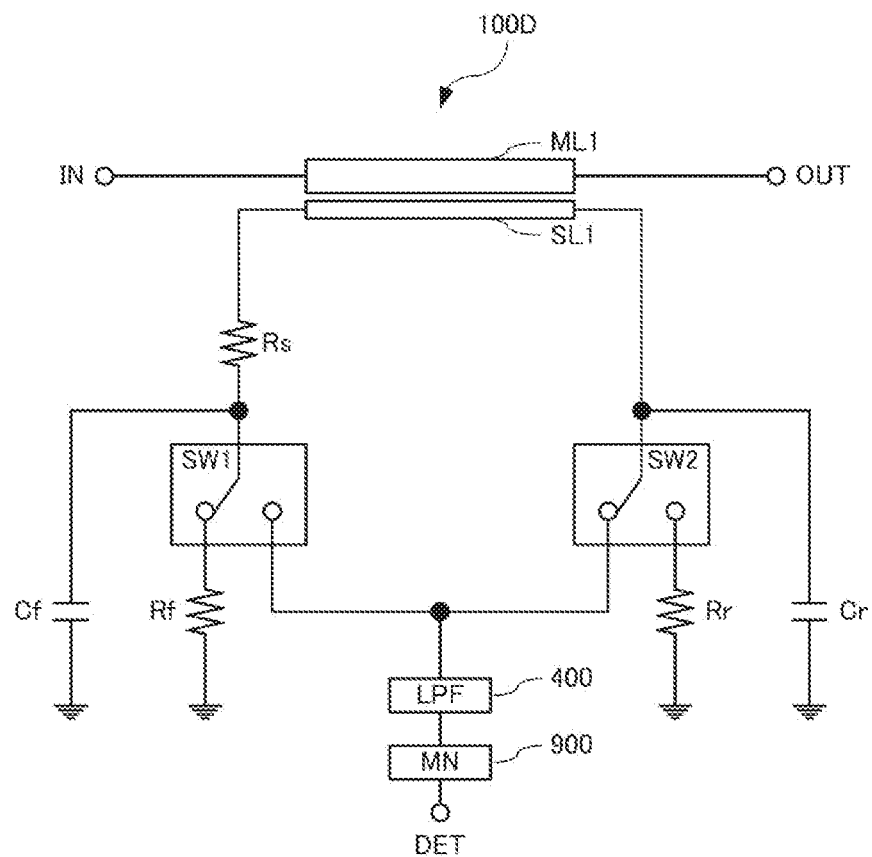
FIG. 10 illustrates an example of the configuration of a bidirectional coupler according to another embodiment of the disclosure.

FIG. 10 illustrates an example of the configuration of a bidirectional coupler 100D according to another embodiment of the disclosure. The same elements as those of the bidirectional coupler 100C shown in FIG. 9 are designated by like reference numerals, and a detailed explanation thereof will be omitted.

The bidirectional coupler 100D differs from the bidirectional coupler 100C in that it includes capacitors Cf and Cr in addition to the elements of the bidirectional coupler 100C. One end of the capacitor Cf (the first capacitor) is connected between the resistor Rs and the switch SW1, and the other end thereof is grounded. One end of the capacitor Cr (the second capacitor) is connected between the sub-line SL1 and the switch SW2, and the other end thereof is grounded. One end of the capacitor Cf may be connected between the sub-line SL1 and the resistor Rs or between the switch SW1 and the resistor Rf. One end of the capacitor Cr may be connected between the switch SW2 and the resistor Rr. The provision of the LPF 400 or the MN 900 may be omitted.

In the bidirectional coupler 100D, a current flowing through the resistors Rf and Rr contains more electric-field coupling components than magnetic-field coupling components. The capacitors Cf and Cr function so as to make the contribution of magnetic-field coupling and that of electric-field coupling substantially equal. This makes it possible to improve the isolation and the directivity in the bidirectional coupler 100D.

Preferred embodiments of the disclosure have been discussed above. In the bidirectional couplers 100A through 100D, the provision of the resistor Rs between the sub-line SL and the switch SW1 can shift the peak of the reverse directivity to the high frequency side. The resistor Rs may be provided between the sub-line SL and the switch SW2 instead of between the sub-line SL and the switch SW1. This can shift the peak of the forward directivity to the high frequency side. The provision of the resistor Rs shifts the peak of the reverse directivity or the forward directivity to the high frequency side, thereby making it possible to compensate for the disturbance of the symmetrical characteristics of the directivity.

In the bidirectional couplers 100B through 100D, the LPF 400 is provided between the switches SW1 and SW2 and the detection port DET. The influence of the coupling degree which increases as the frequency becomes higher (FIG. 6) is canceled by the LPF 400 exhibiting characteristics opposite to those of the coupling degree (FIG. 7), thereby decreasing the frequency dependency of the coupling degree as a whole.

In the bidirectional couplers 100C and 100D, the MN 900 is provided between the LPF 400 and the detection port DET, thereby making it possible to compensate for a loss caused by a reflected signal returned from the detection port DET.

In the bidirectional coupler 100D, the capacitors Cf and Cr are connected in parallel with the resistors Rf and Rr, respectively. The capacitors Cf and Cr function so as to make the contribution of magnetic-field coupling and that of electric-field coupling substantially equal, thereby making it possible to improve the isolation and the directivity in the bidirectional coupler 100D.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bidirectional coupler comprising:
   a first port into which an input signal is inputted;
   a second port from which the input signal is outputted;
   a third port from which a detection signal indicating a result of detecting the input signal or a detection signal indicating a result of detecting a reflected signal is outputted, the reflected signal being returned as a result of outputting the input signal;
   a main line connected at one end to the first port and at the other end to the second port;
   a sub-line electromagnetically coupled with the main line;
   a first resistor grounded at one end;
   a second resistor grounded at one end;
   a first switch connecting one end of the sub-line to the other end of the first resistor or the third port, the first switch comprising a plurality of throws;
   a second switch connecting the other end of the sub-line to the other end of the second resistor or the third port, the second switch comprising a plurality of throws;
   a third resistor constantly connected to one end of the sub-line and the first switch, or constantly connected to the other end of the sub-line and the second switch;

a matching network or a low pass filter disposed between the first and second switches, and the third port;
a chip element the bidirectional coupler is formed in;
a first terminal connected to the first port;
a second terminal connected to the second port;
a ground terminal connected to ground; and
a power supply voltage terminal connected to a power supply, wherein:
when the bidirectional coupler detects the input signal, the first switch electrically connects one end of the sub-line to the other end of the first resistor and the second switch electrically connects the other end of the sub-line to the third port,
when the bidirectional coupler detects the reflected signal, the first switch electrically connects one end of the sub-line to the third port and the second switch electrically connects the other end of the sub-line to the other end of the second resistor,
as seen in a plan view, the chip element has a first side and a second side that face each other, and a third side and a fourth side that face each other and each connect the first side and the second side, a center line extending in the same direction as the first side and second side and dividing the chip element into a first half including the first side and a second half including the second side,
the first terminal of the chip element is disposed in the first half, the second terminal of the chip element is disposed in the second half, and
the ground terminal of the chip element is disposed in the first half but not in the second half, and the power supply voltage terminal of the chip element is disposed in the second half but not in the first half.

2. The bidirectional coupler according to claim 1, comprising the matching network and the low pass filter, wherein the matching network is disposed between the low pass filter and the third port.

3. The bidirectional coupler of claim 2, wherein the low pass filter comprises:
a first inductor;
a fourth resister connected in series with the first inductor;
a third capacitor connected between the first inductor and ground; and
a fourth capacitor connected in parallel with the first inductor and the fourth resistor.

4. The bidirectional coupler according to claim 1, further comprising:
a first capacitor connected at one end to one end of the sub-line and grounded at the other end; and
a second capacitor connected at one end to the other end of the sub-line and grounded at the other end.

5. The bidirectional coupler according to claim 1, further comprising:
a first capacitor connected at one end to one end of the sub-line and grounded at the other end; and
a second capacitor connected at one end to the other end of the sub-line and grounded at the other end.

6. The bidirectional coupler of claim 5, wherein:
the first capacitor is constantly connected to the one end of the sub-line and to ground, and
the second capacitor is constantly connected to the other end of the sub-line and to ground.

7. The bidirectional coupler according to claim 1, wherein the first switch and the second switch are single pole-double throw switches.

8. The bidirectional coupler according to claim 1, wherein the third resistor is directly connected to the one end of the sub-line and the first switch, or is directly connected to the other end of the sub-line and the second switch.

9. The bidirectional coupler of claim 1, wherein a resistance value of the third resistor is fixed.

10. A bidirectional coupler comprising:
a first port into which an input signal is inputted;
a second port from which the input signal is outputted;
a third port from which a detection signal indicating a result of detecting the input signal or a detection signal indicating a result of detecting a reflected signal is outputted, the reflected signal being returned as a result of outputting the input signal;
a main line connected at a first end to the first port and at a second end to the second port;
a sub-line electromagnetically coupled with the main line;
a first resistor grounded at a first end;
a second resistor grounded at a first end;
a first switch that selectively connects a first end of the sub-line to a second end of the first resistor or to the third port, the first switch comprising a plurality of throws;
a second switch that selectively connects a second end of the sub-line to a second end of the second resistor or to the third port, the second switch comprising a plurality of throws;
a third resistor disposed between the first end of the sub-line and the first switch or between the second end of the sub-line and the second switch; a low pass filter disposed between the first switch, the second switch, and the third port a chip element the bidirectional coupler is formed in;
a first terminal connected to the first port;
a second terminal connected to the second port;
a ground terminal connected to ground; and
a power supply voltage terminal connected to a power supply, wherein:
when the bidirectional coupler detects the input signal, the first switch is configured to electrically connect the first end of the sub-line to the second end of the first resistor, and the second switch is configured to electrically connect the second end of the sub-line to the third port,
when the bidirectional coupler detects the reflected signal, the first switch is configured to electrically connect the first end of the sub-line to the third port, and the second switch is configured to electrically connect the second end of the sub-line to the second end of the second resistor,
the low pass filter comprises:
a first inductor; and
a fourth resister connected in series with the first inductor,
as seen in a plan view, the chip element has a first side and a second side that face each other, and a third side and a fourth side that face each other and each connect the first side and the second side, a center line extending in the same direction as the first side and second side and dividing the chip element into a first half including the first side and a second half including the second side,
the first terminal of the chip element is disposed in the first half, the second terminal of the chip element is disposed in the second half, and
the ground terminal of the chip element is disposed in the first half but not in the second half, and the power supply voltage terminal of the chip element is disposed in the second half but not in the first half.

11. The bidirectional coupler of claim 10, further comprising:
 a third capacitor connected between the first inductor and ground.

12. The bidirectional coupler of claim 10, further comprising:
 a fourth capacitor connected in parallel with the first inductor and the fourth resistor.

13. A bidirectional coupler comprising:
 a first port into which an input signal is inputted;
 a second port from which the input signal is outputted;
 a third port from which a detection signal indicating a result of detecting the input signal or a detection signal indicating a result of detecting a reflected signal is outputted, the reflected signal being returned as a result of outputting the input signal;
 a main line connected at a first end to the first port and at a second end to the second port;
 a sub-line electromagnetically coupled with the main line;
 a first resistor grounded at a first end;
 a second resistor grounded at a second end;
 a first switch that selectively connects a first end of the sub-line to a second end of the first resistor or to the third port, the first switch comprising a plurality of throws;
 a second switch that selectively connects a second end of the sub-line to a second end of the second resistor or to the third port, the second switch comprising a plurality of throws; a third resistor disposed between the first end of the sub-line and the first switch, or between the second end of the sub-line and the second switch;
 a first capacitor constantly connected at a first end to the first end of the sub-line and grounded at a second end;
 a second capacitor constantly connected at a first end to the second end of the sub-line and grounded at a second end;
 a chip element the bidirectional coupler is formed in;
 a first terminal connected to the first port;
 a second terminal connected to the second port;
 a ground terminal connected to ground; and
 a power supply voltage terminal connected to a power supply, wherein:
 when the bidirectional coupler detects the input signal, the first switch is configured to electrically connect the first end of the sub-line to the second end of the first resistor and the second switch is configured to electrically connect the second end of the sub-line to the third port,
 when the bidirectional coupler detects the reflected signal, the first switch is configured to electrically connect a first end of the sub-line to the third port and the second switch is configured to electrically connect the second end of the sub-line to the second end of the second resistor,
 as seen in a plan view, the chip element has a first side and a second side that face each other, and a third side and a fourth side that face each other and each connect the first side and the second side, a center line extending in the same direction as the first side and second side and dividing the chip element into a first half including the first side and a second half including the second side,
 the first terminal of the chip element is disposed in the first half, the second terminal of the chip element is disposed in the second half, and
 the ground terminal of the chip element is disposed in the first half but not in the second half, and the power supply voltage terminal of the chip element is disposed in the second half but not in the first half.

14. The bidirectional coupler of claim 13, wherein:
 the first end of the first capacitor is connected between the first switch and the first resistor, and
 the first end of the second capacitor is connected between the second switch and the second resistor.

15. The bidirectional coupler of claim 13, wherein:
 the first end of the first capacitor is connected between the first end of the sub-line and the first switch, and
 the first end of the second capacitor is connected between the second end of the sub-line and the second switch.

* * * * *